United States Patent
Higuchi et al.

(10) Patent No.: US 9,301,406 B2
(45) Date of Patent: Mar. 29, 2016

(54) WIRED CIRCUIT BOARD

(71) Applicant: NITTO DENKO CORPORATION, Osaka (JP)

(72) Inventors: Naotaka Higuchi, Osaka (JP); Tetsuya Ohsawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 314 days.

(21) Appl. No.: 13/661,290

(22) Filed: Oct. 26, 2012

(65) Prior Publication Data

US 2013/0105208 A1    May 2, 2013

Related U.S. Application Data

(60) Provisional application No. 61/557,773, filed on Nov. 9, 2011.

(30) Foreign Application Priority Data

Oct. 27, 2011   (JP) ................................. 2011-235859

(51) Int. Cl.
*H05K 1/11* (2006.01)
*H05K 1/00* (2006.01)
(Continued)

(52) U.S. Cl.
CPC ............... *H05K 3/421* (2013.01); *G11B 5/486* (2013.01); *H05K 1/0219* (2013.01); *H05K 1/056* (2013.01); *H05K 2201/09845* (2013.01); *H05K 2201/09854* (2013.01)

(58) Field of Classification Search
CPC .................................. H05K 1/11; H05K 1/00

USPC .......................................... 174/258, 264, 260
See application file for complete search history.

(56) References Cited

U.S. PATENT DOCUMENTS

2005/0087859 A1*  4/2005  Chao et al. ..................... 257/700
2008/0078573 A1   4/2008  Hu et al.
(Continued)

FOREIGN PATENT DOCUMENTS

EP          1087261 A1 *  3/2001  .............. G03F 7/027
JP      2001-110893 A      4/2001
(Continued)

OTHER PUBLICATIONS

Notification of Reasons for Refusal Issued by the Japanese Patent Office (JPO) on Mar. 10, 2015 in connection with Japanese Patent Application No. 2011-235859.

*Primary Examiner* — Timothy Thompson
*Assistant Examiner* — Charles Pizzuto
(74) *Attorney, Agent, or Firm* — Jean C. Edwards, Esq.; Edwards Neils PLLC

(57) ABSTRACT

A wired circuit board includes a metal supporting layer, a first insulating layer, a conductive layer, a second insulating layer, and a ground layer. The first opening of the first insulating layer is surrounded by the second opening of the second insulating layer when projected in the thickness direction, and the ground layer fills the first opening via the second opening so as to come in contact with an upper surface of the metal supporting layer. Alternatively, the first opening surrounds the second opening when projected in the thickness direction, the second insulating layer fills a peripheral end portion of the first opening, and the ground layer fills the second opening so as to come in contact with the upper surface of the metal supporting layer.

10 Claims, 12 Drawing Sheets

(51) Int. Cl.
*H05K 3/42* (2006.01)
*G11B 5/48* (2006.01)
*H05K 1/02* (2006.01)
*H05K 1/05* (2006.01)

(56) References Cited

U.S. PATENT DOCUMENTS

| | | | |
|---|---|---|---|
| 2009/0151994 A1* | 6/2009 | Ohsawa et al. | 174/261 |
| 2009/0202944 A1* | 8/2009 | Miyasaka et al. | 430/286.1 |
| 2009/0242259 A1 | 10/2009 | Ho et al. | |
| 2009/0301775 A1 | 12/2009 | Hu et al. | |
| 2010/0116540 A1* | 5/2010 | Ishii et al. | 174/262 |
| 2011/0149442 A1 | 6/2011 | Contreras et al. | |
| 2011/0259632 A1 | 10/2011 | Oosawa et al. | |

FOREIGN PATENT DOCUMENTS

| | | | |
|---|---|---|---|
| JP | 2002-185140 A | | 6/2002 |
| JP | 2008-091634 A | | 4/2008 |
| JP | 2009-129490 | | 6/2009 |
| JP | 2009-218329 | | 9/2009 |
| JP | 2009218329 A | * | 9/2009 |
| JP | 2009-246092 A | | 10/2009 |
| JP | 2010-135754 | | 6/2010 |
| JP | 2011-233647 A | | 11/2011 |

* cited by examiner

FIG.7
(a)
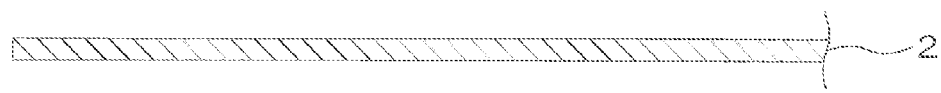
(b)
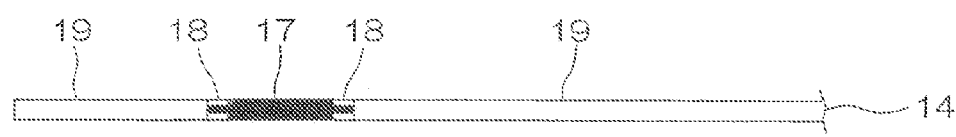
(c)
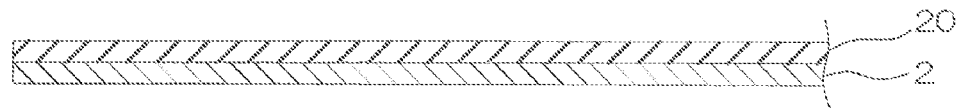
(d)
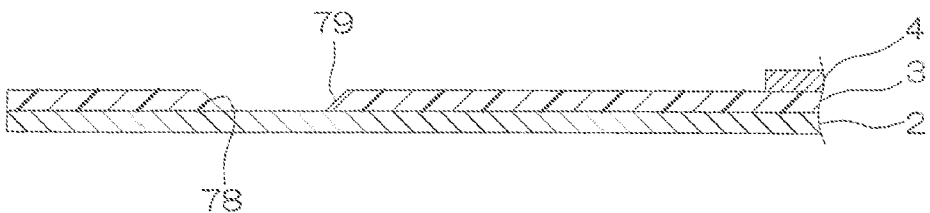

FIG.8
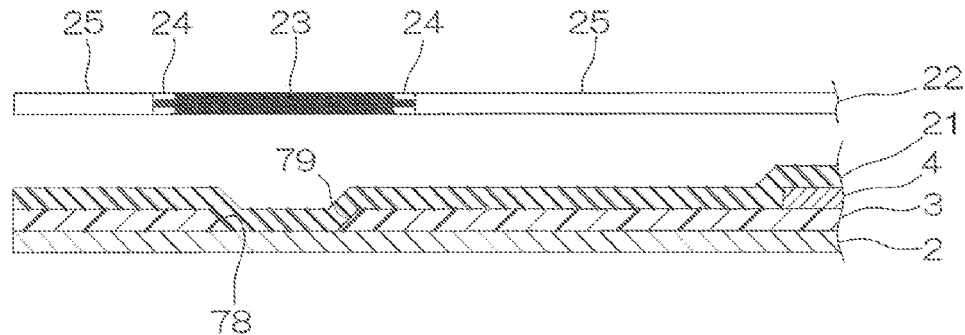
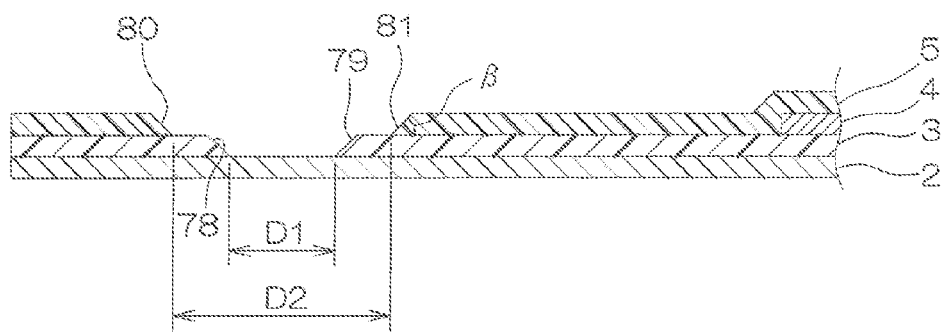
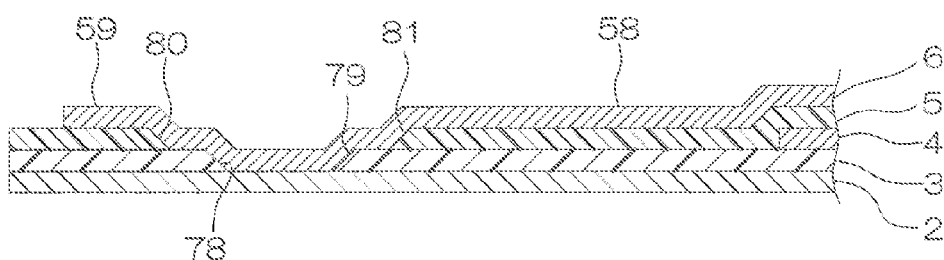
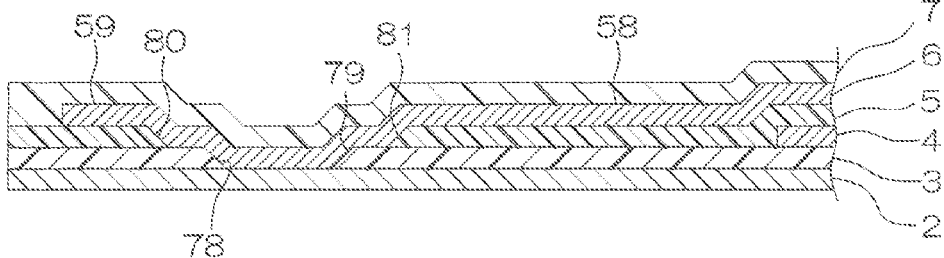

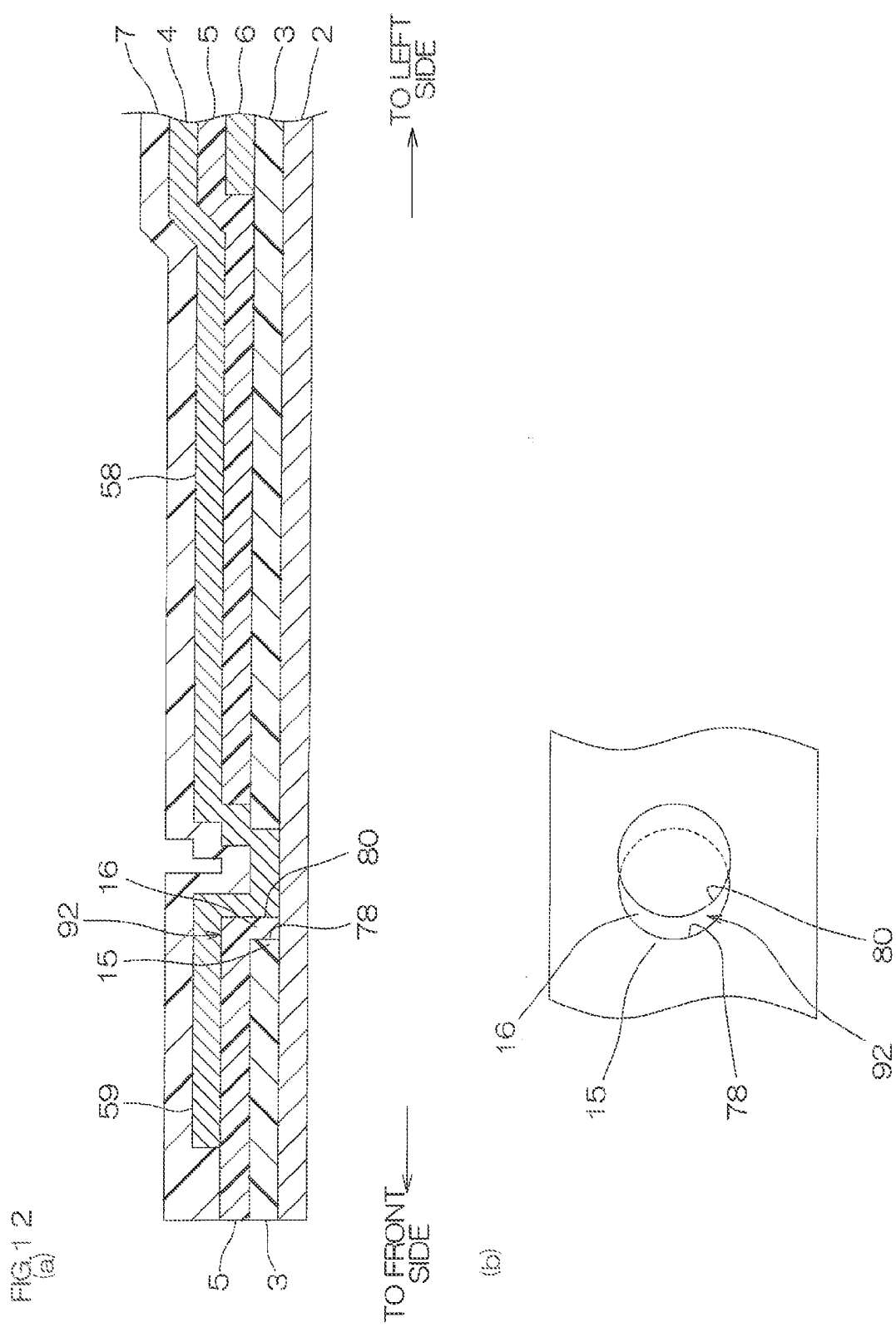

WIRED CIRCUIT BOARD

CROSS-REFERENCE TO RELATED APPLICATION

The present application claims the benefit of U.S. Provisional Application No. 61/557,773, filed on Nov. 9, 2011, and also claims priority from Japanese Application No. 2011-235859 filed on Oct. 27, 2011, the contents of which are herein incorporated by reference into this application.

BACKGROUND OF THE INVENTION

1. Field of the Invention

The present invention relates to a wired circuit board, and particularly to a wired circuit board such as a suspension board with circuit or a flexible wired circuit board.

2. Description of the Related Art

Conventionally, for the purpose of reducing a transmission loss in the signal wire of a conductive pattern, a wired circuit board has been proposed which includes, e.g., an insulating layer, a conductive layer covered therewith, and a ground layer disposed to be spaced apart from the conductive layer (see, e.g., FIGS. 8 and 10 of Japanese Unexamined Patent No. 2008-91634).

In the wired circuit board of Japanese Unexamined Patent No. 2008-91634, the insulating layer includes a second insulating layer and a third insulating layer formed thereon, and the ground layer includes a lower ground layer formed under the second insulating layer, a side ground layer in contact therewith, and an upper ground layer formed on the third insulating layer to be continued to the side ground layer.

In the wired circuit board of Japanese Unexamined Patent No. 2008-91634, the second insulating layer and the third insulating layer have a first opening and a second opening which are each formed in the same shape so as to communicate with each other. The first opening and the second opening are each filled with the side ground layer.

SUMMARY OF THE INVENTION

However, the first opening and the second opening of Japanese Unexamined Patent No. 2008-91634 are formed flush along a thickness direction, so that the contact area between the side ground layer and each of the first opening and the second opening is small. Accordingly, the adhesion of the side ground layer to each of the second insulating layer and the third insulating layer is low, and therefore it may be impossible to sufficiently improve the reliability of the ground layer.

It is therefore an object of the present invention to provide a wired circuit board which allows an improvement in the adhesion of the ground layer to the first insulating layer or the second insulating layer.

A wired circuit board of the present invention includes a metal supporting layer, a first insulating layer formed on the metal supporting layer, a conductive layer formed on the first insulating layer, a second insulating layer formed on the first insulating layer so as to cover the conductive layer, and a ground layer formed on the second insulating layer, wherein the first insulating layer is formed with a first opening extending therethrough in a thickness direction, the second insulating layer is formed with a second opening extending therethrough in the thickness direction to correspond to the first opening, and the first opening is surrounded by the second opening when projected in the thickness direction, and the ground layer fills the first opening via the second opening so as to come in contact with an upper surface of the metal supporting layer, or the first opening surrounds the second opening when projected in the thickness direction, the second insulating layer fills a peripheral end portion of the first opening, and the ground layer fills the second opening so as to come in contact with the upper surface of the metal supporting layer.

In the wired circuit board of the present invention, it is preferable that a peripheral side surface of the first opening in the first insulating layer is formed to be inclined with respect to the thickness direction, and/or a peripheral side surface of the second opening in the second insulating layer is formed to be inclined with respect to the thickness direction.

In the wired circuit board of the present invention, it is preferable that the first insulating layer and/or the second insulating layer is formed of a photosensitive resin.

In the wired circuit board of the present invention, it is preferable that the first insulating layer and/or the second insulating layer is formed by exposing the photosensitive resin to light via a photomask.

In the wired circuit board of the present invention, the first opening is surrounded by the second opening when projected in the thickness direction, and a stepped portion of the first insulating layer is formed in the second opening. Therefore, when filling the first opening via the second opening so as to come in contact with the upper surface of the metal supporting layer, the ground layer can come in contact with the stepped portion of the first insulating layer and tightly adhere thereto. This allows an improvement in the adhesion to the first insulating layer in each of the first opening and the second opening.

Alternatively, when projected in the thickness direction, the first opening surrounds the second opening, and the second insulating layer fills the peripheral end portion of the first opening. Consequently, in the first opening, a stepped portion of the second insulating layer is formed. Therefore, when filling the second opening so as to come in contact with the upper surface of the metal supporting layer, the ground layer can come in contact with the stepped portion of the second insulating layer and tightly adhere thereto. This allows an improvement in the adhesion to the second insulating layer in each of the first opening and the second opening.

As a result, by improving the adhesion of the ground layer to the first insulating layer or the second insulating layer, the reliability of ground connection can be improved.

BRIEF DESCRIPTION OF THE DRAWINGS

FIG. 7 is a process view for illustrating a producing method of the suspension board with circuit shown in FIG. 3, (a) showing the step of preparing a metal supporting layer, (b) showing the step of forming a first base coating, (c) showing the step of forming a first insulating base layer, and (d) showing the step of forming a conductive layer;

FIG. 8 is a process view for illustrating the producing method of the suspension board with circuit shown in FIG. 3, which is subsequent to FIG. 7,
(e) showing the step of forming a second base coating,
(f) showing the step of forming a second insulating base layer,
(g) showing the step of forming a ground layer, and
(h) showing the step of forming an insulating cover layer;

FIG. 12 shows a support-side ground terminal (form in which the second ground opening and the first ground opening are formed to have the same diameter and displaced from each other) of the suspension board with circuit of Comparative Example 1,
(a) showing a cross-sectional view thereof, and
(b) showing an enlarged plan view thereof.

DETAILED DESCRIPTION OF THE INVENTION

Figure 1:
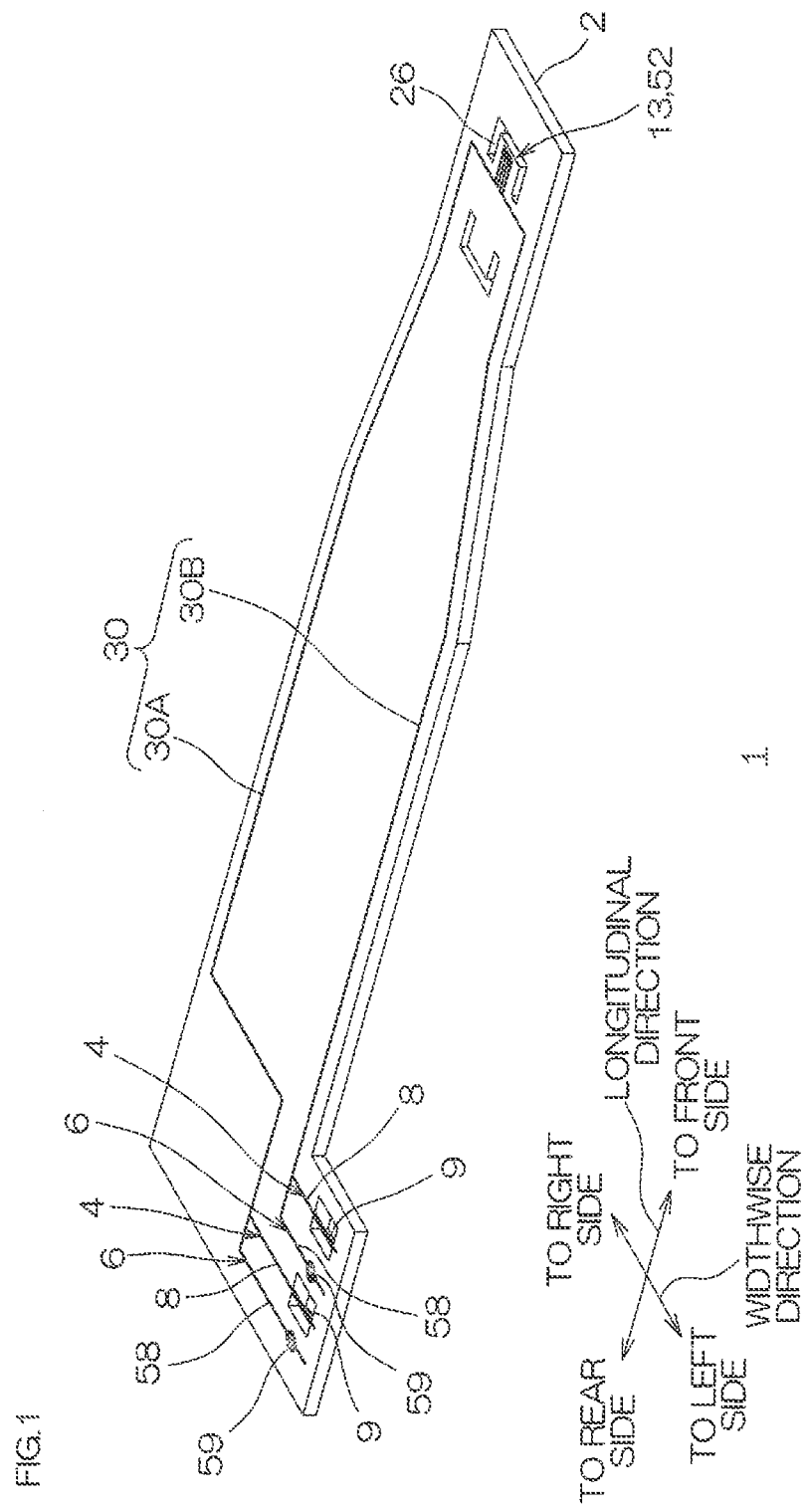
FIG. 1 is a perspective view of a suspension board with circuit as an embodiment of a wired circuit board of the present invention.
Figure 2:
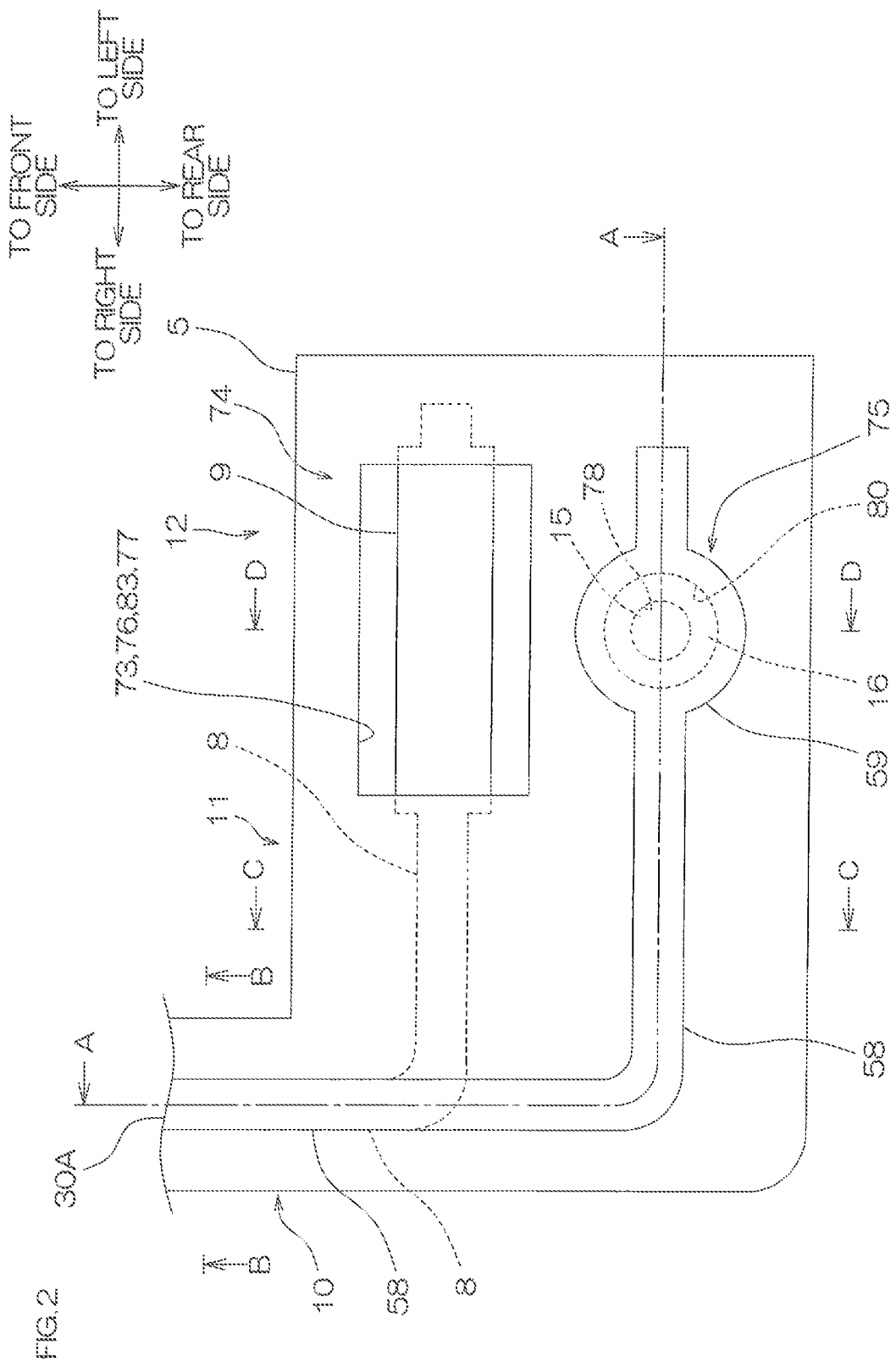
FIG. 2 is an enlarged plan view of the rear end portion of the suspension board with circuit shown in FIG. 1.
Figure 3:
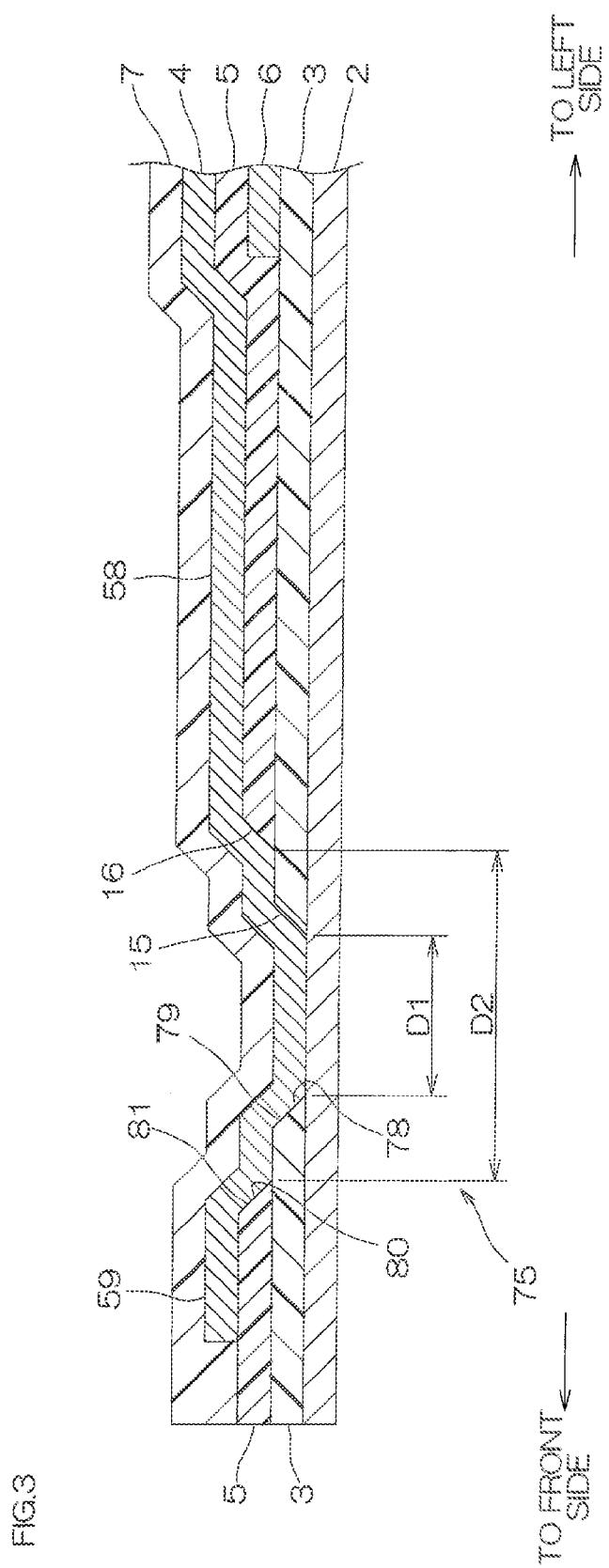
FIG. 3 is an enlarged cross-sectional view along the dot-dash bent line A-A of FIG. 2.
Figure 4:
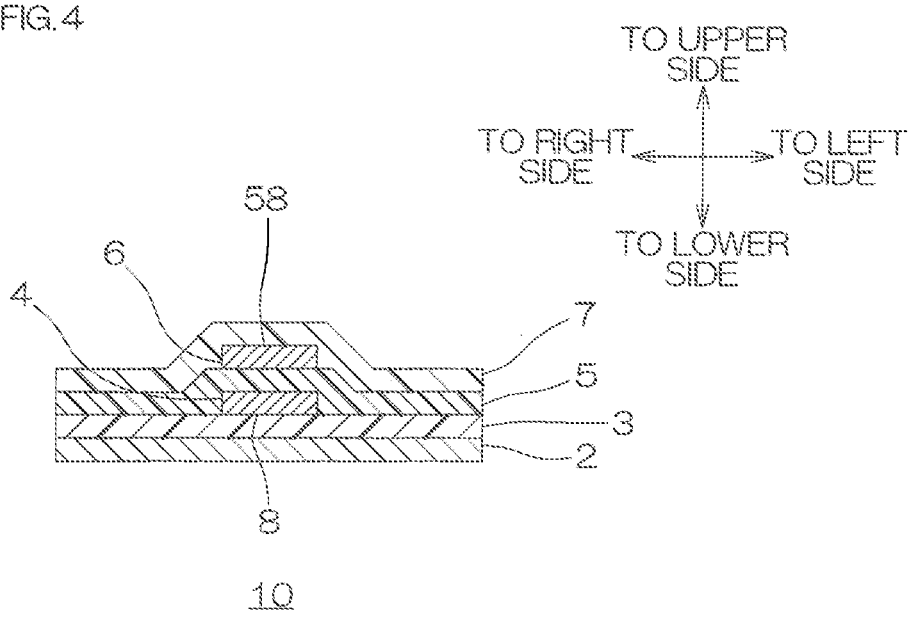
FIG. 4 is an enlarged cross-sectional view along the line B-B of FIG. 2.
Figure 5:
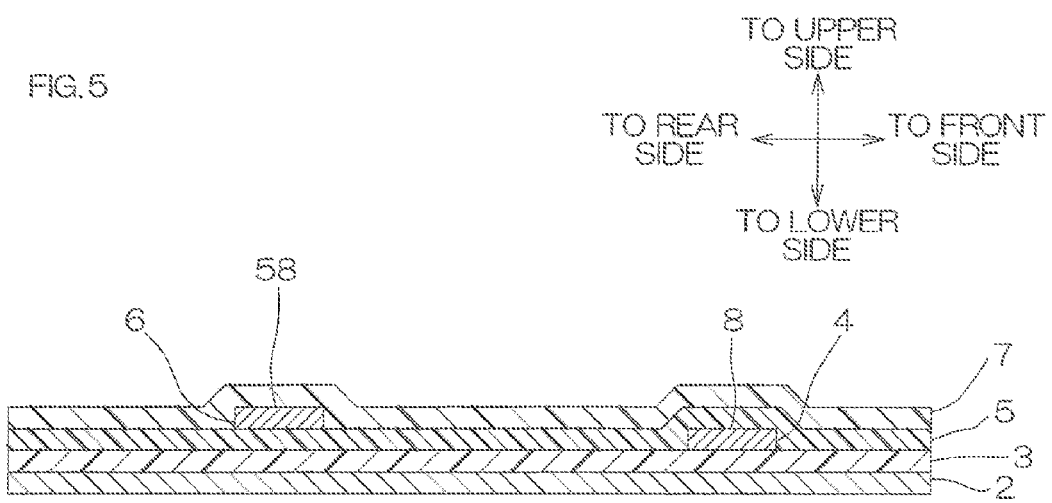
FIG. 5 is an enlarged cross-sectional view along the line C-C of FIG. 2.
Figure 6:
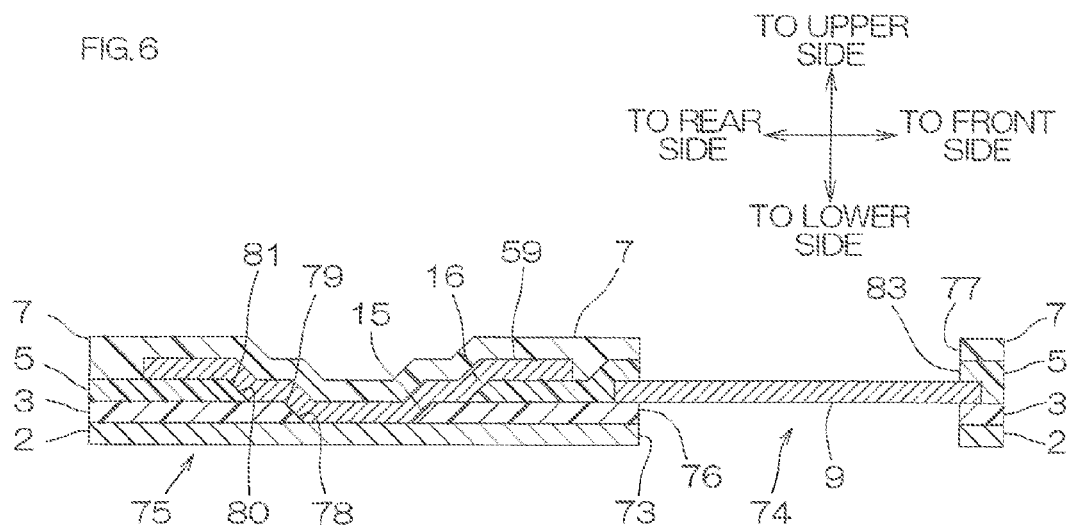
FIG. 6 is an enlarged cross-sectional view along the line D-D of FIG. 2.

FIG. 1 is a perspective view of a suspension board with circuit as an embodiment of a wired circuit board of the present invention. FIG. 2 is an enlarged plan view of the rear end portion of the suspension board with circuit shown in FIG. 1. FIG. 3 is an enlarged cross-sectional view along the dot-dash bent line A-A of FIG. 2. FIG. 4 is an enlarged cross-sectional view along the line B-B of FIG. 2. FIG. 5 is an enlarged cross-sectional view along the line C-C of FIG. 2. FIG. 6 is an enlarged cross-sectional view along the line D-D of FIG. 2. FIG. 7 is a process view for illustrating a producing method of the suspension board with circuit shown in FIG. 3, (a) showing the step of preparing a metal supporting layer, (b) showing the step of forming a first base coating, (c) showing the step of forming a first insulating base layer, and (d) showing the step of forming a conductive layer. FIG. 8 is a process view for illustrating the producing method of the suspension board with circuit shown in FIG. 3, which is subsequent to FIG. 7, (e) showing the step of forming a second base coating, (f) showing the step of forming a second insulating base layer, (g) showing the step of forming a ground layer, and (h) showing the step of forming an insulating cover layer.

Note that, in FIG. 2, an insulating cover layer 7 is omitted for clear illustration of relative positioning of a conductive layer 4 and a ground layer 6 each described later.

In FIG. 1, on a suspension board with circuit 1, a magnetic head (not shown) is mounted. The suspension board with circuit 1 is also connected to a read/write board (not shown) which transmits a write signal to the magnetic head and receives a read signal from the magnetic head and mounted in a hard disk drive (not shown). In the suspension board with circuit 1, a metal supporting layer 2 extending in a longitudinal direction (front-rear direction), and the conductive layer 4 and the ground layer 6 each supported by the metal supporting layer 2 are integrally formed.

The metal supporting layer 2 is formed of a metal foil or a metal thin plate in a flat plate shape, and the front end portion (one longitudinal end portion) thereof is formed with a gimbal 26 on which the magnetic head is mounted.

The conductive layer 4 electrically connects the magnetic head and the read/write board.

The conductive layer 4 and the ground layer 6 are provided as each of pairs of signal/ground wires (wire pairs 30). In the suspension board with circuit 1, two wire pairs 30 are provided. That is, the wire pairs 30 are provided in a wire formation portion 10 (see FIG. 2) described later and on both sides of the suspension board with circuit 1 in a left-right direction (direction perpendicular to the longitudinal direction, or widthwise direction).

In each of a right-side wire pair (wire pair on one side) 30A and a left-side wire pair (wire pair on the other side) 30B, the conductive layer 4 integrally includes a head-side signal terminal 13 for connecting to a terminal of the magnetic head, an external signal terminal 9 for connecting to a terminal (not shown) of the read/write board, and a signal wire 8 for connecting the head-side signal terminal 13 and the external signal terminal 9.

Also, in each of the right-side wire pair 30A and the left-side wire pair 30B, the ground layer 6 integrally includes a head-side ground terminal 52 for connecting to a terminal of the magnetic head, a support-side ground terminal 59 for connecting to the metal supporting layer 2, and a ground wire 58 for connecting the head-side ground terminal 52 and the support-side ground terminal 59.

As shown in FIG. 4, the suspension board with circuit 1 includes the metal supporting layer 2, a first insulating base layer 3 as an insulating layer formed on the metal supporting layer 2, the conductive layer 4 formed on the first insulating base layer 3, a second insulating base layer 5 as a second insulating layer formed on the first insulating base layer 3 so as to cover the conductive layer 4, and the ground layer 6 formed on the second insulating base layer 5. The suspension board with circuit 1 also includes an insulating cover layer 7 formed on the second insulating base layer 5 so as to cover the ground layer 6.

Next, the rear end portion of the suspension board with circuit 1 is described in detail with reference to FIGS. 2 and 6. Note that, in the subsequent description, of the right-side wire pair 30A and the left-side wire pair 30B, only the right-side wire pair 30A is shown as an example. However, the left-side wire pair 30B is the same as in the description of the right-side wire pair 30A, and therefore a description thereof is omitted.

In FIG. 2, in the rear end portion of the suspension board with circuit 1, the wire formation portion 10, a terminal formation portion 12, and a middle portion 11 formed continuously between the wire formation portion 10 and the terminal formation portion 12 are integrally provided.

In the wire formation portion 10, as shown in FIG. 4, the first insulating base layer 3 is formed on the metal supporting layer 2. The first insulating base layer 3 is laminated on the upper surface of the metal supporting layer 2 so as to correspond to the signal wire 8.

On the first insulating base layer 3, the signal wire 8 is formed. As shown in FIG. 1, the signal wire 8 is formed to linearly extend toward the front end portion of the suspension board with circuit 1.

On the first insulating base layer 3, as shown in FIG. 4, the second insulating base layer 5 is laminated so as to cover the signal wire 8.

On the second insulating base layer 5, the ground wire 58 is formed so as to overlap the signal wire 8 when projected in a thickness direction (top-bottom direction).

On the second insulating base layer 5, the insulating cover layer 7 is laminated so as to cover the ground wire 58.

The wire formation portion 10 is formed as a region corresponding to a portion in which the right-side wire pair 30A, i.e., the signal wire 8 and the ground wire 58 overlap each other in the thickness direction.

As shown in FIG. 2, the middle portion 11 is formed as a middle region connecting the wire formation portion 10 to the terminal formation portion 12 described next.

In the middle portion 11, as shown in FIG. 5, the first insulating base layer 3 is formed on the metal supporting layer 2. The first insulating base layer 3 is laminated on the upper surface of the metal supporting layer 2. The first insulating base layer 3 in the middle portion 11 is formed continuously from the first insulating base layer 3 (see FIG. 4) in the wire formation portion 10.

On the first insulating base layer 3, the signal wire 8 is formed. As shown in FIG. 1, the signal wire 8 is formed in a generally L-shape in plan view which is midway bent leftward in the middle portion 11.

On the first insulating base layer 3, as shown in FIG. 5, the second insulating base layer 5 covering the signal wire 8 is laminated. The second insulating base layer 5 is provided so as to correspond to the signal wire 8 and the ground wire 58. More specifically, the second insulating base layer 5 is formed on the upper surface and side surfaces of the signal wire 8 and the upper surface of the first insulating base layer 3 around the signal wire 8 to have a generally L-shape in plan view (see FIG. 2).

In the middle portion 11, on the second insulating base layer 5, the ground wire 58 is formed.

As shown in FIG. 2, in the middle portion 11, the ground wire 58 is formed in a generally L-shape in plan view which is midway bent leftward.

That is, of the ground wire 58 in the middle portion 11, the pre-bending portion linearly continued from the ground wire 58 in the wire formation portion 10 is disposed so as to overlap the signal wire 8 in the middle portion 11 in plan view (when projected in the vertical direction), as shown in FIG. 4.

On the other hand, of the ground wire 58 in the middle portion 11, the post-bending portion linearly continued to the ground wire 58 in the terminal formation portion 12 is disposed on the rear side of the signal wire 8 in the middle portion 11 in plan view, as shown in FIG. 5.

That is, in the middle portion 11, as shown in FIG. 2, the signal wire 8 is bent widthwise outwardly on the front side of the ground wire 58. Accordingly, the ground wire 58 is disposed such that the pre-bending portion thereof partway overlaps the entire pre-bending portion of the signal wire 8 and the subsequent part of the pre-bending portion thereof and the post-bending portion thereof do not overlap the signal wire 8. That is, as shown in FIG. 5, the post-bending portion of the ground wire 58 is disposed on the rear side of the post-bending portion of the signal wire 8 in parallel and spaced-apart relation when projected in the thickness direction.

Also, the ground wire 58 is formed on the same insulating layer as the insulating layer (see FIG. 4) on which the ground wire 58 in the wire formation portion 10 is formed, i.e., on the second insulating base layer 5. Also, the ground wire 58 is formed so as to be continued to the support-side ground terminal 59 described next.

On the second insulating base layer 5, the insulating cover layer 7 covering the ground wire 58 is formed.

As shown in FIG. 2, in the terminal formation portion 12, the external signal terminal 9 and the support-side ground terminal 59 are formed. The region where the external signal terminal 9 is formed is defined as a signal terminal formation region 74, and the region where the support-side ground terminal 59 is formed is defined as a ground terminal formation region 75.

In the signal terminal formation region 74, as shown in FIG. 6, the metal supporting layer 2 is formed with a support opening 73 corresponding to the external signal terminal 9.

The support opening 73 extends through the metal supporting layer 2 in the thickness direction thereof, and is formed in a generally rectangular shape in plan view elongated in the left-right direction, as shown in FIG. 2.

As shown in FIG. 6, in the signal terminal formation region 74, the first insulating base layer 3 is formed on the metal supporting layer 2 around the support opening 73.

The first insulating base layer 3 is formed with a first base opening 76 communicating with the support opening 73. The first base opening 76 is formed to extend through the first insulating base layer 3 in the thickness direction thereof and have the same shape as that of the support opening 73 in plan view.

As shown in FIG. 6, on the first insulating base layer 3 on both sides of the first base opening 76 in the front-rear direction, the external signal terminal 9 is formed. As shown in FIG. 2, the external signal terminal 9 is formed so as to traverse the first base opening 76 in the front-rear direction. The external signal terminal 9 is formed as an angular land having a width larger than the width of the signal wire 8.

As shown in FIG. 6, the lower surface of the external signal terminal 9 is exposed from the support opening 73 and the first base opening 76.

On the first insulating base layer 3 around the first base opening 76, the second insulating base layer 5 is formed so as to cover the both ends of the external signal terminal 9 in the front-rear direction.

The second insulating base layer 5 is formed with the second opening 83 communicating with the first base opening 76.

The second base opening 83 is formed so as to extend through the second insulating base layer 5 in the thickness direction thereof and have the same shape as that of the first insulating base opening 76 in plan view, as shown in FIG. 2.

On the second insulating base layer 5, the insulating cover layer 7 is formed.

The insulating cover layer 7 is formed with a cover opening 77. The cover opening 77 is formed so as to extend through the insulating cover layer 7 in the thickness direction thereof and have the same shape as that of the second base opening 83 in plan view, as shown in FIG. 2.

As shown in FIG. 6, in the signal terminal formation region 74, the external signal terminal 9 is formed as a flying lead having the lower surface thereof exposed from the support opening 73 and the first base opening 76 and the upper surface thereof exposed from the second base opening 83 and the cover opening 77.

As shown in FIG. 2, the ground terminal formation region 75 is formed on the rear side of the signal terminal formation region 75 in parallel and spaced-apart relation.

In the ground terminal formation region 75, as shown in FIGS. 3 and 6, the first insulating base layer 3 is formed on the metal supporting layer 2.

The first insulating base layer 3 has a first ground opening 78 (see FIG. 7(c)) formed as a first opening extending therethrough in the thickness direction.

As shown by the broken line in FIG. 2, the first ground opening 78 is formed in a generally circular shape in plan view. Note that, as shown in FIGS. 3 and 6, of the first insulating base layer 3, the portion facing the first ground opening 78 (specifically the surrounding area of the first ground opening 78) is formed as a first stepped portion 15.

A first peripheral side surface 79 of the first ground opening 78 in the first insulating base layer 3 is formed as an inclined surface which is inclined with respect to the thickness direction. Specifically, the first peripheral side surface 79 is inclined in a tapered shape in which the two-dimensional cross-sectional area of the first ground opening 78 gradually decreases (i.e., the diameter thereof decreases) downward.

On the first insulating base layer 3, the second insulating base layer 5 is formed.

The second insulating base layer 5 has a second ground opening 80 formed as a second opening extending therethrough in the thickness direction to correspond to the first ground opening 78.

As shown by the broken line in FIG. 2, the second ground opening 80 is formed to surround the first ground opening 78 when projected in the thickness direction. Specifically, the second ground opening 80 is formed in a generally circular shape in plan view having the center thereof common to that of the first ground opening 78. That is, the second ground opening 80 is formed in a shape similar to and larger than that of the first ground opening 78 in plan view.

Also, of the second insulating base layer 5, as shown in FIGS. 3 and 6, the portion facing the second ground opening 80 (specifically, the surrounding area of the second ground opening 80) is formed as a second stepped portion 16.

Accordingly, the first stepped portion 15 of the first insulating base layer 3 and the second stepped portion 16 of the second insulating base layer 5 form a two-leveled stepped portion which stepwise descends inward in a radial direction.

A second peripheral side surface 81 of the second ground opening 80 in the second insulating base layer 5 is formed as an inclined surface which is inclined with respect to the thickness direction. Specifically, the second peripheral side surface 81 is formed to be inclined in a tapered shape in which the two-dimensional cross-sectional area of the second ground opening 80 gradually decreases (i.e., the diameter thereof decreases) downward.

The support-side ground terminal 59 is formed on the second insulating base layer 5 around the second ground opening 80.

The support-side ground terminal 59 is formed in a generally circular shape having an outer shape which includes the first ground opening 78 and the second ground opening 80 when projected in the thickness direction.

The inner portion of the support-side ground terminal 59 fills the first ground opening 78 via the second ground opening 80.

Specifically, the support-side ground terminal 59 is formed so as to be inwardly recessed from the second stepped portion 16 of the second insulating base layer 5 along the second peripheral side surface 81 of the second ground opening 80 in the second insulating base layer 5. Then, in the second ground opening 80, the support-side ground terminal 59 is formed along the upper surface of the first stepped portion 15 of the first insulating base layer 3 formed in the second ground opening 80. Subsequently, the support-side ground terminal 59 is formed so as to be recessed along the first peripheral side surface 79 of the first ground opening 78 of the first insulating base layer 3. Thereafter, the support-side ground terminal 59 is formed on the upper surface of the metal supporting layer 2 (metal supporting layer 2 exposed from the first ground opening 78) in the first stepped portion 15.

In this manner, the support-side ground terminal 59 comes in contact with the upper surface of the metal supporting layer 2 in the first ground opening 78. That is, the support-side ground terminal 59 is electrically connected to the metal supporting layer 2. As a result, the ground layer 6 is grounded (connected to the ground).

On the second insulating base layer 5, the insulating cover layer 7 is formed so as to cover the support-side ground terminal 59.

On the other hand, as shown in FIG. 1, on the front end portion of the suspension board with circuit 1, the right-side wire pair 30A and the left-side wire pair 30B are disposed in parallel in the vicinity of the gimbal 26. That is, the head-side signal terminal 13 and the head-side ground terminal 52 of the right-side wire pair 30A are disposed in widthwise parallel relation with the head-side signal terminal 13 and the head-side ground terminal 52 of the left-side wire pair 30B so that the front end portion of the suspension board with circuit 1 has the same configuration as that of each of the terminal formation portion 12 and the middle portion 11 described above.

Also, the middle portion (intermediate portion in the front-rear direction between the front end portion and the rear end portion) of the suspension board with circuit 1 has the same configuration as that of the wire formation portion 10 in the rear end portion thereof.

Next, a producing method of the suspension board with circuit 1 is described with reference to FIGS. 7 and 8.

First, in the method, as shown in FIG. 7(a), the metal supporting layer 2 is prepared. Examples of a metal material used for forming the metal supporting layer 2 include stainless steel and a 42-alloy. Preferably, stainless steel (such as, e.g., SUS 304 based on the AISI (American Iron and Steel Institute) standards) or the like is used. The thickness of the metal supporting layer 2 is in a range of, e.g., 10 to 30 μm, or preferably 15 to 25 μm.

Next, in the method, as shown in FIGS. 7(b) and 7(c), the first insulating base layer 3 is formed on the metal supporting layer 2 to have the first ground opening 78 and the first peripheral side surface 79 (inclined surface).

Examples of an insulating material used for forming the first insulating base layer 3 include resins such as polyimide, polyether nitrile, polyether sulfone, polyethylene terephthalate, polyethylene naphthalate, and polyvinyl chloride. Among them, a photosensitive resin is used preferably or, more preferably, photosensitive polyimide is used.

To form the first insulating base layer 3, as shown in, e.g., FIG. 7(b), a solution of a photosensitive resin (varnish) is applied to the entire upper surface of the metal supporting layer 2 and dried to form a first base coating 20.

Then, via a first gradation photomask 14 as a photomask, the first base coating 20 is exposed to light.

The first gradation photomask 14 has a mask pattern including a first light shielding portion 17, a first light semi-transmitting portion 18, and a first light full transmitting portion 19. The first light semi-transmitting portion 18 has a light transmissivity which is set to gradually increase with distance from the first light shielding portion 17 and with approach to the first light full transmitting portion 19.

Then, the first gradation photomask 14 is disposed over the first base coating 20.

Specifically, the first light full transmitting portion 19 is caused to face a portion where the first insulating base layer 3 (see FIG. 7(c)) is formed, the first light semi-transmitting portion 18 is caused to face a portion where the first peripheral side surface 79 (see FIG. 7(c)) is formed, and the first light shielding portion 17 is caused to face a portion where the first insulating base layer 3 is not formed (including the first ground opening 78, see FIG. 7(c)).

Thereafter, the first base coating 20 is exposed to light applied thereto from above via the first gradation photomask 14.

Subsequently, using a developer, development is performed by dissolving the portion facing the first light shielding portion 17, i.e., the unexposed portion and partially dissolving the portion facing the first light semi-transmitting portion 18, i.e., the semi-exposed portion that has been exposed to an adjusted degree. Then, the first base coating 20 is cured as necessary.

In this manner, as shown in FIG. 7(d), the first insulating base layer 3 is formed in a pattern having the first ground opening 78 and the first peripheral side surface 79.

The thickness of the first insulating base layer 3 thus formed is in a range of, e.g., 1 to 25 µm, or preferably 1 to 10 µm.

The first ground opening 78 has an inner diameter D1 which is in a range of, e.g., 10 to 100 µm, or preferably 15 to 60 µm.

An angle (inclination angle) α formed between the first peripheral side surface 79 and the upper surface of the metal supporting layer 2 is in a range of, e.g., 0.35 to 85 degrees, or preferably 0.5 to 45 degrees.

Next, in the method, as shown in FIG. 7(d), the conductive layer 4 is formed in the foregoing pattern on the first insulating base layer 3.

Examples of a material used for forming the conductive layer 4 include a metal material such as copper, nickel, gold, a solder, or an alloy thereof. Among them, copper is used preferably.

To form the conductive layer 4, a known patterning method such as, e.g., an additive method or a subtractive method is used. Preferably, the additive method is used.

In the additive method, over the entire upper surfaces of the metal supporting layer 2 and the first insulating base layer 3, a first metal thin film (seed film) not shown is formed first. For the first metal thin film, metal materials such as copper, chromium, nickel, and an alloy thereof are used. The first metal thin film is formed by a thin-film formation method such as sputtering or plating. Preferably, the first metal thin film is formed by sputtering.

Next, on the surface of the first metal thin film, a dry film resist is provided, exposed to light, and developed to form a plating resist in a pattern reverse to that of the conductive layer 4, which is not shown. Then, by electrolytic plating, the conductive layer 4 is formed on the surface of the first metal thin film exposed from the plating resist. Then, the plating resist and the portion of the first metal thin film where the plating resist is formed are removed by etching or the like.

The thickness of the conductive layer 4 thus formed is in a range of, e.g., 3 to 50 µm, or preferably 5 to 15 µm.

The width of each of the signal wires 8 (see FIG. 2) is a in a range of, e.g., 10 to 300 µm, or preferably 15 to 150 µm. The width of each of the head-side signal terminals 13 and the external signal terminals 9 (see FIG. 2) is in a range of, e.g., 10 to 15000 µm, or preferably 30 to 1000 µm.

In this manner, as shown in FIG. 1, the conductive layer 4 is formed in a wired circuit pattern in which the signal wires 8, the external signal terminals 9, and the head-side signal terminals 13 are integrally formed.

Next, in the method, as shown in FIGS. 8(e) and 8(f), the second insulating base layer 5 is formed on the first insulating base layer 3 into the foregoing pattern having the second ground opening 80 and the second peripheral side surface 81.

As an example of an insulating material for forming the second insulating base layer 5, the same insulating material as the material of the first insulating base layer 3 shown above is used.

To form the second insulating base layer 5, as shown in, e.g., FIG. 8(e), a solution of a photosensitive resin (varnish) is applied to the entire upper surfaces of the metal supporting layer 2, the first insulating base layer 3, and the conductive layer 4 and dried to form the second coating 21.

Thereafter, via a second gradation photomask 22 as a photomask, the second base coating 21 is exposed to light.

The second gradation photomask 22 has a mask pattern including a second light shielding portion 23, a second light semi-transmitting portion 24, and a second light full-transmitting portion 25. The second light semi-transmitting portion 24 has a light transmissivity which is set to gradually increase with distance from the second light shielding portion 23 and with approach to the second light full-transmitting portion 25.

Then, the second gradation photomask 22 is disposed over the second base coating 21.

Specifically, the second light full-transmitting portion 25 is caused to face a portion where the second insulating base layer 5 (see FIG. 8(f)) is formed, the second light semi-transmitting portion 24 is caused to face a portion where the second peripheral side surface 79 (see FIG. 8(f)) is formed, and the second light shielding portion 23 is caused to face a portion where the second insulating base layer 5 is not formed (including the second ground opening 80 (see FIG. 8(f)) and the second base opening 83 (see FIG. 2)).

Thereafter, the second base coating 21 is exposed to light applied thereto from above via the second gradation photomask 22.

Subsequently, using a developer, development is performed by dissolving the portion facing the second light shielding portion 23, i.e., the unexposed portion and partially dissolving the portion facing the second light semi-transmitting portion 24, i.e., the semi-exposed portion that has been exposed to an adjusted degree. Then, the second base coating 21 is cured as necessary.

In this manner, as shown in FIG. 8(f), the second insulating base layer 5 is formed in a pattern having the second ground opening 80, the second peripheral side surface 81, and the second base opening 83.

The thickness of the second insulating base layer 5 thus formed is in a range of, e.g., 1 to 50 µm, or preferably 1.5 to 15 µm.

The second ground opening 80 has an inner diameter D2 which is in a range of, e.g., over 100%, or preferably 110 to 900% of the inner diameter D1 of the first ground opening 78. Specifically, the inner diameter D2 of the second ground opening 80 is in a range of, e.g., 20 to 200 µm, or preferably 35 to 100 µm.

An angle (inclination angle) β formed between the second peripheral side surface 81 and the upper surface of the first insulating base layer 3 is in a range of, e.g., 0.35 to 85 degrees, or preferably 0.5 to 45 degrees.

Next, in the method, as shown in FIG. 8(g), the ground layer 6 is formed in the foregoing pattern.

As a material for forming the ground layer 6, the same material as the material of the conductive layer 4 shown above is used.

To form the ground layer 6, the same patterning method as mentioned above is used. Preferably, the additive method is used.

In the additive method, over the entire upper surfaces of the metal supporting layer 2, the first insulating base layer 3, and the second insulating base layer 5, a second metal thin film (seed film) not shown is formed. For the second metal thin film, the same metal material as shown above is used. The second metal thin film is formed by the same thin-film formation method as described above. Preferably, the second metal thin film is formed by sputtering.

Next, on the surface of the second metal thin film, a dry film resist is provided, exposed to light, and developed to form a plating resist in a pattern reverse to that of the ground layer 6, which is not shown. Then, by electrolytic plating, the ground layer 6 is formed on the surface of the second metal thin film exposed from the plating resist. Then, the plating resist and the portion of the second metal thin film where the plating resist is formed are removed by etching or the like.

The thickness of the ground layer 6 thus formed is in a range of, e.g., 3 to 50 μm or preferably 5 to 15 μm. The width of each of the ground wires 58 may be the same as or different from the width of each of the signal wires 8, and is in a range of, e.g., 10 to 300 μm, or preferably 15 to 150 μm.

The outer diameter of each of the support-side ground terminals 59 is in a range of, e.g., 100 to 1000 μm, or preferably 150 to 500 μm.

The width of each of the head-side ground terminals 52 (see FIG. 1) is in a range of, e.g., 10 to 15000 μm, or preferably 30 to 1000 μm.

Next, in the method, as shown in FIG. 8(*h*), the insulating cover layer 7 is formed in the foregoing pattern having the cover opening 77 (see FIG. 2).

As an insulating material for forming the insulating cover layer 7, the same insulating material as the insulating material of the first insulating base layer 3 shown above is used.

To form the insulating cover layer, e.g., a solution of a photosensitive resin (varnish) is applied to the entire upper surfaces of the metal supporting layer 2, the second insulating base layer 5, and the ground layer 6 and dried to form a cover coating (not shown). Then, the cover coating is exposed to light via a photomask and developed.

Then, the cover coating is cured as necessary to form the insulating cover layer 7 in the foregoing pattern having the cover opening 77.

Note that the formation of the insulating cover layer 7 is not limited to the method described above. For example, it is also possible to preliminarily form a resin into a film formed with the cover opening 77 and stick the film to the entire upper surfaces of the metal supporting layer 2, the second insulating base layer 5, and the ground layer 6 via a known adhesive layer.

The thickness of the insulating cover layer 7 thus formed is in a range of, e.g., 2 to 10 μm, or preferably 3 to 6 μm.

Next, in the method, as shown in FIG. 6, the metal supporting layer 2 is opened to form the support opening 73. Subsequently, the first insulating base layer 3 is opened to form the first base opening 76.

To open the metal supporting layer 2, wet etching such as, e.g., chemical etching is used.

To open the first insulating base layer 3, dry etching such as, e.g., plasma etching using the metal supporting layer 2 as a mask or the like is used.

In this manner, the external signal terminal 9 can be formed as the flying lead.

Note that the length (longitudinal length) of each of the support opening 73 and the first base opening 76 is in a range of, e.g., 50 to 1500 μm.

Then, as necessary, a metal plating layer not shown is formed on the surface of the external signal terminal 9. The metal plating layer is made of a metal material such as gold, and formed by plating such as, e.g., electrolytic plating or electroless plating. The thickness of the metal plating layer is in a range of, e.g., 0.2 to 5 μm. Note that, over the surface of each of the head-side signal terminal 13 and the head-side ground terminal 52 also, a metal plating layer is similarly formed.

Thereafter, the metal supporting layer 2 is trimmed to form the gimbal 26, as shown in FIG. 1. In this manner, the suspension board with circuit 1 can be obtained.

In the suspension board with circuit 1, as shown in FIG. 3, the first ground opening 78 is surrounded by the second ground opening 80 when projected in the thickness direction and, in the second ground opening 80, the first stepped portion 15 of the first insulating base layer 3 is formed.

Therefore, when filling the first ground opening 78 via the second ground opening 80 so as to come in contact with the upper surface of the metal supporting layer 2, the support-side ground terminal 59 can come in contact with the first stepped portion 15 of the first insulating base layer 3 and tightly adhere thereto. This allows an improvement in the adhesion to the first insulating base layer 3 in each of the first ground opening 78 and the second ground opening 80.

As a result, by improving the adhesion of the support-side ground terminal 59 to the first insulating base layer 3, it is possible to improve the reliability of ground connection (grounding).

In addition, the first peripheral side surface 79 of the first ground opening 78 in the first insulating base layer 3 is formed as an inclined surface which is inclined with respect to the thickness direction, and the second peripheral side surface 81 of the second ground opening 80 in the second insulating base layer 5 is formed as an inclined surface which is inclined with respect to the thickness direction.

Accordingly, the contact area of the support-side ground terminal 59 with each of the first peripheral side surface 79 and the second peripheral side surface 81 can be increased compared to that in the case (see FIG. 11) in which the first peripheral side surface 79 and the second peripheral side surface 81 are formed as vertical surfaces along the thickness direction.

Consequently, it is possible to further improve the adhesion of the support-side ground terminal 59 to each of the first peripheral side surface 79 and the second peripheral side surface 81.

Moreover, in the embodiment of FIG. 3, the support-side ground terminal 59 is allowed to tightly adhere to the two-leveled stepped portion including the first stepped portion 15 and the second stepped portion 16 in the first insulating base layer 3 and the second insulating base layer 5. This can further improve the adhesion to each of the first insulating base layer 3 and the second insulating base layer 5.

Note that, in the embodiment of FIGS. 7 and 8, the first insulating base layer 3 is formed by exposing the first base coating 20 to light via the first gradation photomask 14, and the second insulating base layer 5 is formed by exposing the second base coating 21 to light via the second gradation photomask 22.

Figure 11:
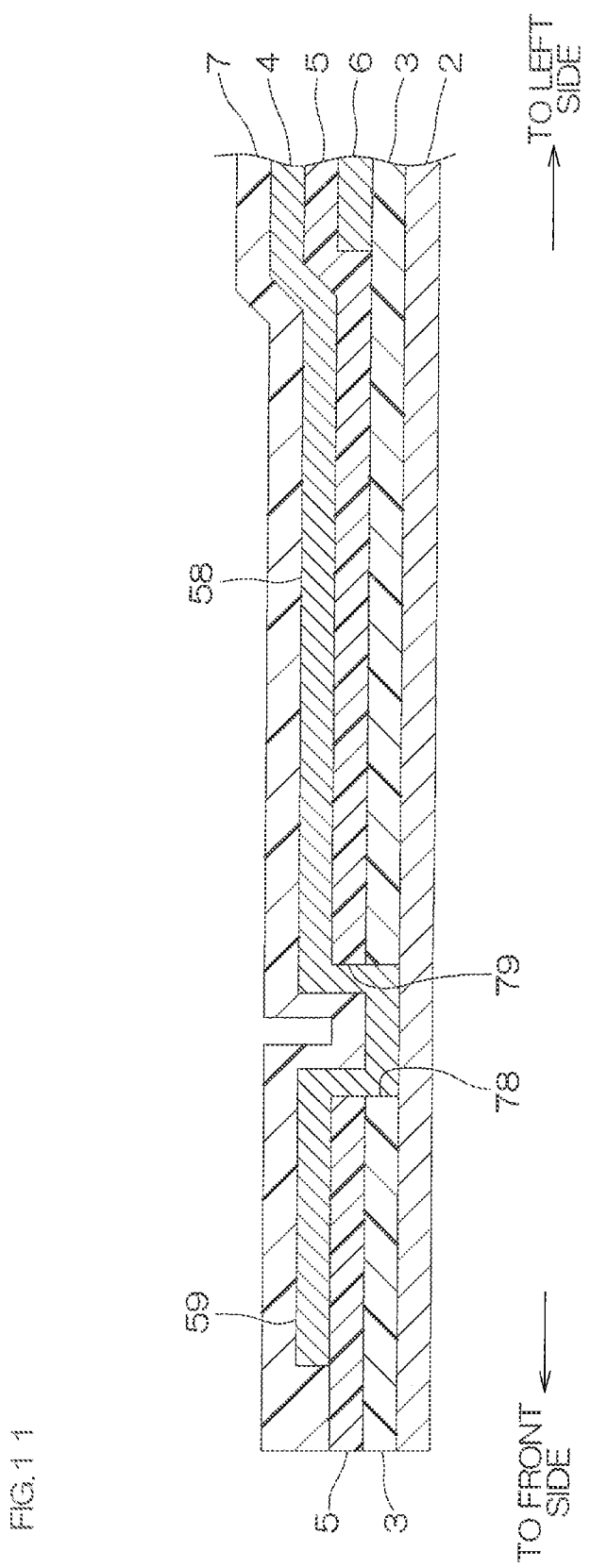
FIG. 11 is an enlarged cross-sectional view of a support-side ground terminal (form in which a second ground opening and a first ground opening are formed to have the same diameter) of a suspension board with circuit of Comparative Example 1.

However, to form the first ground opening 78 and the second ground opening 80 such that they are flush, i.e., have the same diameter as shown in FIG. 11, the first light shielding portion 17 (see FIG. 7(*b*)) and the second light shielding portion (see FIG. 8(*e*)) should have the same dimensions. At this time, the position of the second light shielding portion 23 relative to the position of the first light shielding portion 17 is slightly shifted (displaced). Consequently, as shown in FIG. 12, the first ground opening 78 formed thereafter is not surrounded by the second ground opening 80 when projected in the thickness direction, and the first stepped portion 15 and the second stepped portion 16 cross each other. That is, the second stepped portion 16 intrudes into the first ground opening 78, and such an intruding portion 92 comes in contact with the upper surface of the metal supporting layer 2 in the first ground opening 78. Accordingly, the contact area of the support-side ground terminal 59 with the upper surface of the metal supporting layer 2 is reduced by the displacement described above. As a result, it may be impossible to sufficiently improve the reliability of the ground connection.

However, in the embodiment of FIG. 3, the inner diameter D1 of the first light shielding portion 17 is set smaller than the inner diameter D2 of the second light shielding portion 23 such that the first ground opening 78 is surrounded by the second ground opening 80 when projected in the thickness direction.

Accordingly, even if the position of the second light shielding portion 23 (see FIG. 8(b)) relative to the position of the first light shielding portion 17 (see FIG. 7(b)) is slightly shifted (displaced by, e.g., about 10 µm), the first ground opening 78 formed thereafter is surrounded by the second ground opening 80 when projected in the thickness direction. Therefore, the contact area with the upper surface of the metal supporting layer 2 in the first ground opening 78 is not reduced even by the displacement described above. As a result, it is possible to sufficiently improve the reliability of the ground connection.

Figure 9:
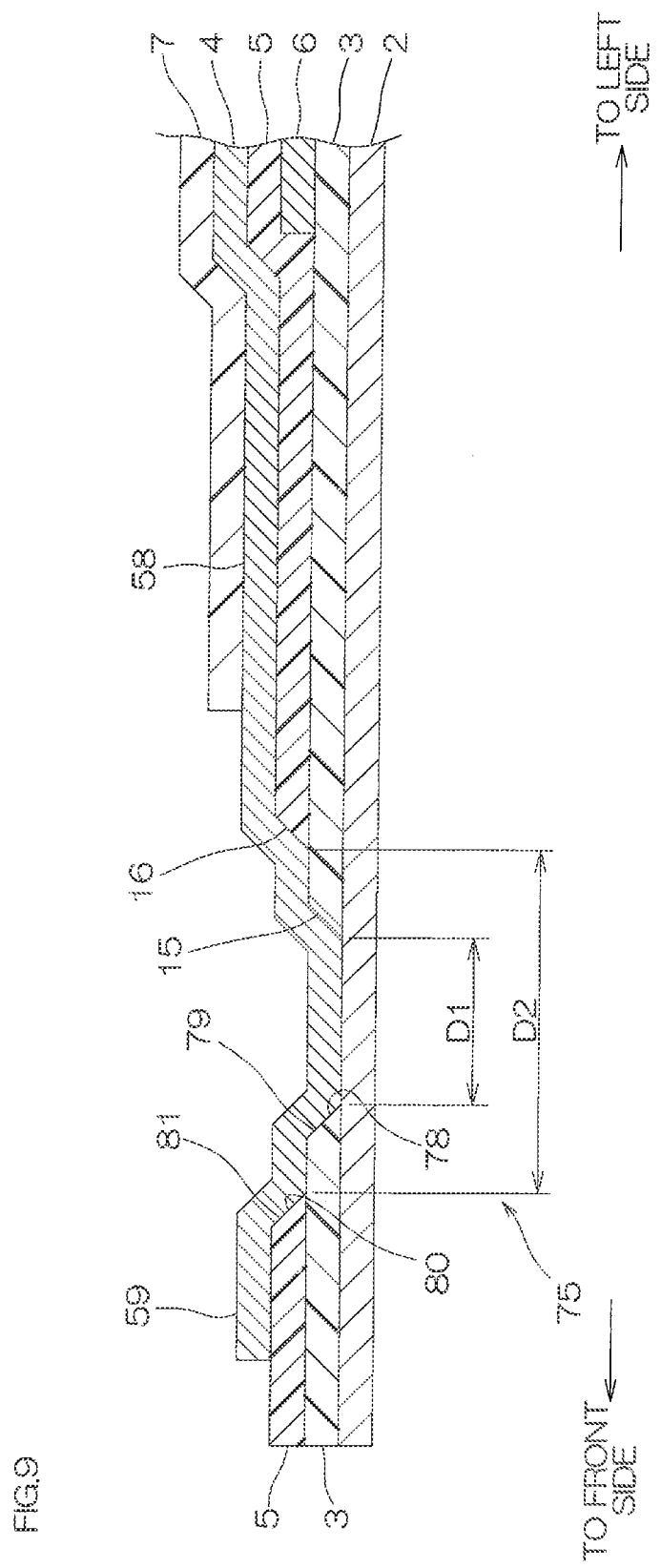
FIG. 9 is an enlarged cross-sectional view of a support-side ground terminal (form in which the support-side ground terminal is exposed) of a suspension board with circuit as another embodiment of the wired circuit board of the present invention.
Figure 10:
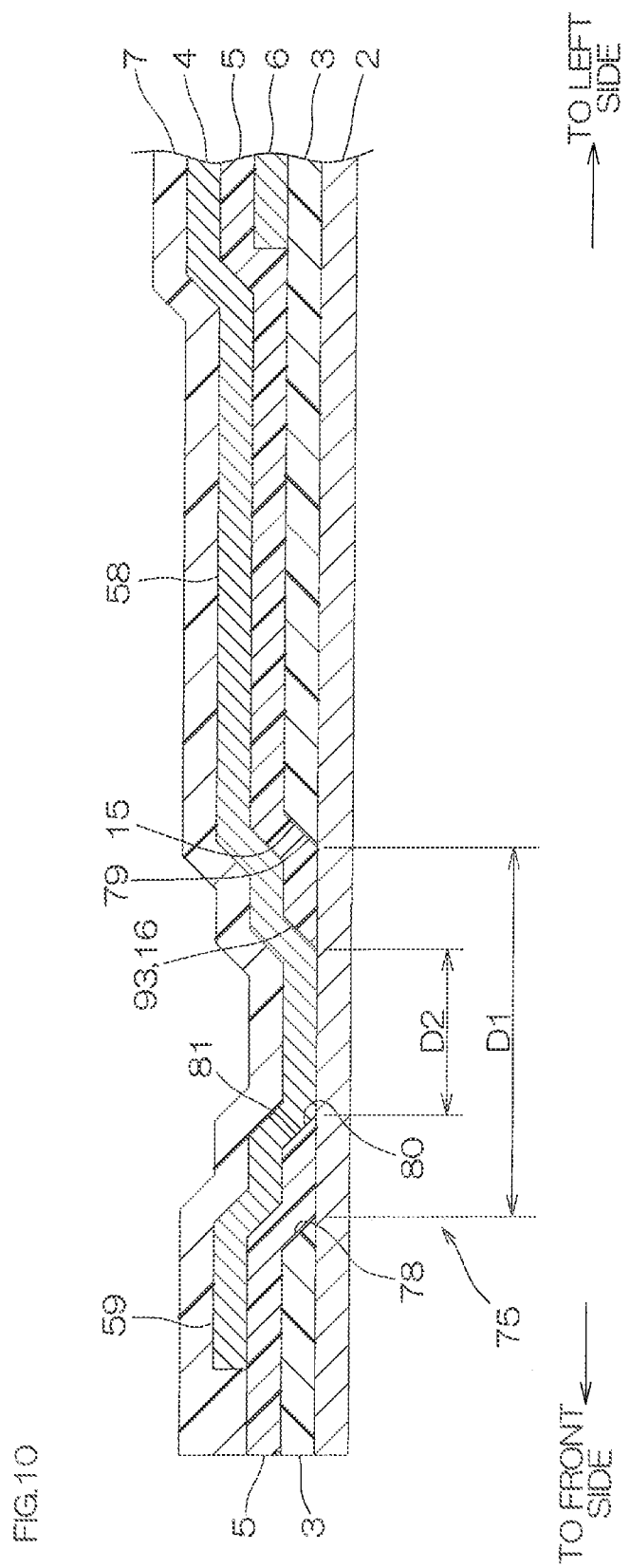
FIG. 10 is an enlarged cross-sectional view of a support-side ground terminal (form in which a second ground opening is surrounded by a first ground opening) of a suspension board with circuit as still another embodiment of the wired circuit board of the present invention.

FIG. 9 is an enlarged cross-sectional view of a support-side ground terminal (form in which the support-side ground terminal is exposed) of a suspension board with circuit as another embodiment of the wired circuit board of the present invention. FIG. 10 is an enlarged cross-sectional view of a support-side ground terminal (form in which a second ground opening is surrounded by a first ground opening) of a suspension board with circuit as still another embodiment of the wired circuit board of the present invention.

Note that the members corresponding to the individual components described above are designated by the same reference numerals in each of the subsequent drawings, and a detailed description thereof is omitted.

In the embodiment of FIG. 3, the insulating cover layer 7 is provided in the ground terminal formation region 75, but the configuration thereof is not limited thereto. For example, as shown in, e.g., FIG. 9, it is also possible to expose the support-side ground terminal 59 without providing the insulating cover layer 7.

The embodiment of FIG. 9 can achieve the same kind of function and effect as achieved in the embodiment of FIG. 1.

In the embodiment of FIG. 3, the first ground opening 78 is formed so as to be surrounded by the second ground opening 80 when projected in the thickness direction. However, as shown in FIG. 10, it is also possible to form the first insulating base layer 3 and the second insulating base layer 5 in a configuration reverse to the configuration described above such that the second ground opening 80 is surrounded by the first ground opening 78 when projected in the thickness direction.

In FIG. 10, the second insulating base layer 5 is formed on the upper surface of the first insulating base layer 3 so as to be recessed from the first stepped portion 15 of the first insulating base layer 3 along the first peripheral side surface 79 of the first insulating base layer 3 and then protrude into the first ground opening 78 in the first insulating base layer 3. Specifically, a protruding portion 93 of the second insulating base layer 5 fills the peripheral end portion of the first ground opening 78. The protruding portion 93 of the second insulating base layer 5 is formed as the second stepped portion 16 on the upper surface of the metal supporting layer 2.

The second stepped portion 16 is in contact with the upper surface of the metal supporting layer 2. Consequently, the ground layer 6 is grounded (connected to the ground).

Next, a producing method of the suspension board with circuit 1 shown in FIG. 10 is described.

First, in the method, as shown in FIG. 7(a), the metal supporting layer 2 is prepared.

Next, in the method, as shown in FIGS. 7(b) and 7(c), the first insulating base layer 3 is formed on the metal supporting layer 2 to have the first ground opening 78 and the first peripheral side surface 79.

The inner diameter D1 of the first ground opening 78 is in a range of, e.g., 20 to 200 µm, or preferably 35 to 100 µm.

Next, in the method, as shown in FIG. 7(d), the conductive layer 4 is formed in the foregoing pattern on the first insulating base layer 3.

Next, in the method, as shown in FIGS. 8(e) and 8(f), the second insulating base layer 5 is formed on the metal supporting layer 2 and the first insulating base layer 3 into the foregoing pattern having the protruding portion 93, the second ground opening 80, and the second peripheral side surface 81.

The inner diameter D2 of the second ground opening 80 is in a range of, e.g., less than 100%, or preferably 10 to 90% of the inner diameter D1 of the first ground opening 78. Specifically, the inner diameter D2 of the second ground opening 80 is in a range of, e.g., 10 to 100 µm, or preferably 15 to 60 µm.

Next, in the method, as shown in FIG. 8(g), the ground layer 6 is formed in the foregoing pattern.

Next, in the method, as shown in FIG. 2, the insulating cover layer 7 is formed in the foregoing pattern.

Next, in the method, as shown in FIG. 6, the metal supporting layer 2 is opened to form the support opening 73. Subsequently, the first insulating base layer 3 is opened to form the first base opening 76.

Then, as necessary, a metal plating layer not shown is formed on the surface of each of the external signal terminals 9. Subsequently, the metal supporting layer 2 is trimmed to form the gimbal 26 as shown in FIG. 1, whereby the suspension board with circuit 1 is obtained.

In the suspension board with circuit 1 of FIG. 10, the first ground opening 78 surrounds the second ground opening 80 when projected in the thickness direction, and the second insulating base layer 5 fills the peripheral end portion of the first ground opening 78. Consequently, in the first ground opening 78, the second stepped portion 16 of the second insulating base layer 5 is formed. Therefore, when filling the second ground opening 80 so as to come in contact with the upper surface of the metal supporting layer 2, the support-side ground terminal 59 can come in contact with the second stepped portion 16 of the second insulating base layer 5 and tightly adhere thereto. This allows an improvement in the adhesion to the second insulating base layer 5 in each of the first ground opening 78 and the second ground opening 80.

As a result, by improving the adhesion of the ground layer 6 to the second insulating base layer 5, it is possible to improve the reliability of ground connection.

In particular, the support-side ground terminal 59 is formed continuously to the upper surface and side surfaces (including the second peripheral side surface 79) of the second insulating base layer 5 without being formed on the first insulating base layer 3. That is, the support-side ground terminal 59 is formed continuously to the surface of the one insulating base layer.

Accordingly, compared to the support-side ground terminal 59 of FIG. 3 which is formed over the surfaces of the two insulating base layers (the first insulating base layer 3 and the second insulating base layer 5), the support-side ground terminal 59 of FIG. 10 can have further improved adhesion to the second insulating base layer 5 without coming off the interface between the first insulating base layer 3 and the second insulating base layer 5.

In the foregoing embodiment, the wired circuit board of the present invention is described by way of example as the suspension board with circuit including the metal supporting layer 2. However, the wired circuit board of the present invention is not limited thereto, and can also be formed as, e.g., a flexible wired circuit board including the metal supporting layer 2 as a reinforcing layer, though not shown.

EXAMPLES

While in the following, the present invention is described more specifically with reference to Examples and Comparative Example, the present invention is by no means limited thereto.

Example 1

(Form in Which First Ground Opening is Surrounded by Second Ground Opening: FIG. 3)

First, a metal supporting layer made of stainless steel (SUS 304) foil having a thickness of 25 μm was prepared (see FIG. 7(a)). Then, a varnish of a photosensitive polyamic acid resin was applied to the entire upper surface of the metal supporting layer and dried to form a first base coating (see FIG. 7(b)).

Subsequently, a first gradation exposure photomask including the mask pattern described above was disposed over the first base coating. Then, the first base coating was exposed to light via the first gradation exposure photomask, subsequently developed, and further cured by heating. In this manner, a first insulating base layer made of polyimide and having a thickness of 5 μm was formed (see FIG. 7(c)).

In the first insulating base layer, a first ground opening having a circular shape in plan view having an inner diameter (D1) of 60 μm and a first peripheral side surface (inclined surface) having an inclination angle (α) of 1.15° were formed.

Then, on the insulating base layer, a conductive layer was formed by an additive method.

Specifically, in the additive method, over the entire upper surfaces of the metal supporting layer and the first insulating base layer, a chromium thin film having a thickness of 0.03 μm and a copper thin film having a thickness of 0.07 μm were successively formed as a first metal thin film by chromium sputtering and copper sputtering. Then, a plating resist in a pattern reverse to that of the conductive layer was formed on the surface of the first metal thin film. Then, on the surface of the first metal thin film exposed from the plating resist, the conductive layer having a thickness of 10 μm was formed by electrolytic copper plating. Then, the plating resist and the portion of the first metal thin film where the plating resist was formed were removed by chemical etching (see FIG. 7(d)).

Note that the width of each of signal wires was 50 μm. The width of each of external signal terminals and head-side signal terminals was 280 μm.

Then, on the entire upper surfaces of the metal supporting board, the first insulating base layer, and the conductive layer, a varnish of a photosensitive polyamic acid resin was applied and dried to form a second base coating (see FIG. 8(e)).

Subsequently, a second gradation photomask including the mask pattern described above was disposed over the second base coating. Then, the second base coating was exposed to light via the second gradation photomask, subsequently developed, and further cured by heating. In this manner, a second insulating base layer made of polyimide and having a thickness of 5 μm was formed (see FIG. 8(f)).

In the second insulating base layer, a second ground opening surrounding the first ground opening and having a circular shape in plan view having an inner diameter (D2) of 100 μm and a second peripheral side surface (inclined surface) having an inclination angle (β) of 1.15° were formed. Also, in the second insulating base layer, a second base opening was formed to expose the upper surface of the external signal terminal (see FIG. 2).

Then, a ground layer was formed by an additive method.

In the additive method, over the entire upper surfaces of the metal supporting board, the first insulating base layer, and the second insulating base layer, a chromium thin film having a thickness of 0.03 μm and a copper thin film having a thickness of 0.07 μm were successively formed as a second metal thin film by chromium sputtering and copper sputtering. Then, a plating resist in a pattern reverse to that of the ground layer was formed on the surface of the second metal thin film. Then, on the surface of the second metal thin film exposed from the plating resist, the ground layer having a thickness of 10 μm was formed by electrolytic copper plating. Then, the plating resist and the portion of the second metal thin film where the plating resist was formed were removed by chemical etching (see FIG. 8(g)).

A support-side ground terminal was formed in a circular shape having an outer diameter of 160 μm including the second ground opening, and the center thereof filled the first ground opening so as to come in contact with the upper surface of the metal supporting layer (see FIG. 3).

Then, to the entire upper surface of the metal supporting layer, the second insulating base layer, and the ground layer, a varnish of a photosensitive polyamic acid resin was applied, dried, then exposed to light, developed, and further cured by heating to form an insulating cover layer made of polyimide and having a thickness of 5 μm into a pattern formed with a cover opening (see FIG. 8(h)).

Then, the metal supporting layer was opened by chemical etching to form a support opening (see FIG. 1). Subsequently, the first insulating base layer was opened by plasma etching to form a base opening and thereby form the external signal terminal as a flying lead.

Thereafter, the metal supporting layer was trimmed to form a gimbal, whereby a suspension board with circuit was obtained (see FIG. 1).

Example 2

(Form in Which Second Ground Opening is Surrounded by First Ground Opening: FIG. 10)

A suspension board with circuit was obtained in the same manner as in Example 1 except that the inner diameter (D1) of the first ground opening was changed to 100 μm in the formation of the first insulating base layer, the inner diameter (D2) of the second ground opening was changed to 60 μm in the formation of the second insulating base layer, and the second ground opening was formed to be surrounded by the first ground opening (see FIG. 1).

Comparative Example 1

A suspension board with circuit was obtained in the same manner as in Example 1 except that, in the formation of the second insulating base layer, the inner diameter (D2) of the second ground opening was changed to 60 μm, i.e., the inner diameter (D1) of the first ground opening and the inner diameter (D2) of the second ground opening were equalized (to 60

μm), and the second ground opening and the first ground opening were formed to overlap each other (see FIG. 11).

(Evaluation)

(Adhesion)

The adhesions of the support-side ground terminals to the first insulating base layers and the second insulating base layers of Examples 1 and 2 and Comparative Example 1 were evaluated as follows.

That is, by checking the change rates of conduction resistance values in a thermal impact test, the adhesions were evaluated.

As a result, it was confirmed that the support-side ground terminals of Examples 1 and 2 had improved adhesions to the first insulating base layer and the second insulating base layer compared to those of the support-side ground terminals of Comparative Example 1.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A wired circuit board, comprising:
   a metal supporting layer;
   a first insulating layer formed on the metal supporting layer;
   a conductive layer formed on the first insulating layer;
   a second insulating layer formed on the first insulating layer so as to cover the conductive layer; and
   a ground layer formed on the second insulating layer, wherein
   the first insulating layer is formed with a first opening extending therethrough in a generally circular shape in a thickness direction,
   the second insulating layer is formed with a second opening extending therethrough in a generally circular shape in the thickness direction to correspond to the first opening, and
   the first opening is surrounded by the second opening when projected in the thickness direction, and the ground layer fills the first opening via the second opening so as to come in contact with an upper surface of the metal supporting layer.

2. A wired circuit board according to claim 1, wherein
   a peripheral side surface of the first opening in the first insulating layer is formed to be inclined with respect to the thickness direction, and/or
   a peripheral side surface of the second opening in the second insulating layer is formed to be inclined with respect to the thickness direction.

3. A wired circuit board according to claim 1, wherein the first insulating layer and/or the second insulating layer is formed of a photosensitive resin.

4. A wired circuit board according to claim 3, wherein the first insulating layer and/or the second insulating layer is formed by exposing the photosensitive resin to light via a photomask.

5. A wired circuit board according to claim 1, wherein the first insulating layer comprises a first stepped portion which is a surrounding area of the first opening, the second insulating layer comprises a second stepped portion which is a surrounding area of the second opening, and the first stepped portion and the second stepped portion form a two-leveled stepped portion which stepwise descends inwardly.

6. A wired circuit board according to claim 5, wherein the ground layer is formed so as to be inwardly recessed from the second stepped portion along a peripheral side surface of the second opening in the second insulating layer, then, in the second opening, formed along a surface of the first stepped portion, subsequently, formed so as to be recessed along a peripheral side surface of the first opening in the first insulating layer, and thereafter, formed on the upper surface of the metal supporting layer exposed from the first opening.

7. A wired circuit board according to claim 1, wherein the ground layer has a thickness in a range of 3 μm to 50 μm.

8. A wired circuit board, comprising:
   a metal supporting layer;
   a first insulating layer formed on the metal supporting layer;
   a conductive layer formed on the first insulating layer;
   a second insulating layer formed on the first insulating layer so as to cover the conductive layer; and
   a ground layer formed on the second insulating layer, wherein
   the first insulating layer is formed with a first opening extending therethrough in a thickness direction,
   the second insulating layer is formed with a second opening extending therethrough in the thickness direction to correspond to the first opening, and
   the first opening surrounds the second opening when projected in the thickness direction, the second insulating layer fills a peripheral end portion of the first opening, and the ground layer fills the second opening so as to come in contact with the upper surface of the metal supporting layer.

9. A wired circuit board according to claim 8, wherein the first insulating layer comprises a first stepped portion which is a surrounding area of the first opening, and
   wherein the second insulating layer is formed so as to be recessed from the first stepped portion along a peripheral side surface of the first opening in the first insulating layer and then protrude into the first opening, thereby forming a two-leveled stepped portion which stepwise descends inwardly.

10. A wired circuit board, comprising:
    a metal supporting layer;
    a first insulating layer formed on the metal supporting layer;
    a conductive layer formed on the first insulating layer;
    a second insulating layer formed on the first insulating layer so as to cover the conductive layer; and
    a ground layer formed on the second insulating layer,
    wherein the first insulating layer is formed with a first opening extending therethrough in a thickness direction,
    wherein the second insulating layer is formed with a second opening extending therethrough in the thickness direction to correspond to the first opening,
    wherein the first opening is surrounded by the second opening when projected in the thickness direction, and the ground layer fills the first opening via the second opening so as to come in contact with an upper surface of the metal supporting layer,
    wherein the first insulating layer comprises a first stepped portion which is a surrounding area of the first opening, the second insulating layer comprises a second stepped portion which is a surrounding area of the second opening, and the first stepped portion and the second stepped portion form a two-leveled stepped portion which stepwise descends inwardly, and
    wherein the ground layer is formed so as to be inwardly recessed from the second stepped portion along a peripheral side surface of the second opening in the second insulating layer, then, in the second opening, formed along a surface of the first stepped portion, subsequently, formed so as to be recessed along a peripheral side surface of the first opening in the first insulating layer, and thereafter, formed on the upper surface of the metal supporting layer exposed from the first opening.

* * * * *